US012684924B2

(12) United States Patent (10) Patent No.: US 12,684,924 B2
Avramescu et al. (45) Date of Patent: Jul. 14, 2026

(54) OPTOELECTRONIC COMPONENT AND METHOD FOR PRODUCING A LIGHT-EMITTING SEMICONDUCTOR BODY

(71) Applicant: ams-OSRAM International GmbH, Regensburg (DE)

(72) Inventors: Adrian Stefan Avramescu, Regensburg (DE); Norwin von Malm, Nittendorf (DE); Peter Stauss, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 561 days.

(21) Appl. No.: 18/043,942

(22) PCT Filed: Oct. 27, 2021

(86) PCT No.: PCT/EP2021/079840
§ 371 (c)(1),
(2) Date: Mar. 3, 2023

(87) PCT Pub. No.: WO2022/090319
PCT Pub. Date: May 5, 2022

(65) Prior Publication Data
US 2024/0030275 A1    Jan. 25, 2024

(30) Foreign Application Priority Data
Oct. 30, 2020    (DE) .......................... 102020128679.1

(51) Int. Cl.
*H10H 29/14*        (2025.01)
(52) U.S. Cl.
CPC ................................. *H10H 29/142* (2025.01)

(58) Field of Classification Search
None
See application file for complete search history.

(56) References Cited

U.S. PATENT DOCUMENTS

| | | | | |
|---|---|---|---|---|
| 2009/0140274 A1* | 6/2009 | Wierer, Jr. | ........... | H10H 20/815 |
| | | | | 257/97 |
| 2011/0272720 A1* | 11/2011 | Gardner | .............. | H10H 20/851 |
| | | | | 257/E33.068 |

(Continued)

FOREIGN PATENT DOCUMENTS

| | | |
|---|---|---|
| WO | 2010112980 A1 | 10/2010 |
| WO | 2012065536 A1 | 5/2012 |

OTHER PUBLICATIONS

Wikipedia, "III-V compound semiconductors," https://de.wikipedia.org/wiki/III-V-Verbindungshalbleiter#/media/Datei:III-V-Halbleiter.png, Jan. 5, 2023, 4 pages.

*Primary Examiner* — Bilkis Jahan
(74) *Attorney, Agent, or Firm* — Slater Matsil, LLP

(57) ABSTRACT

In an embodiment an optoelectronic component includes a carrier, a first semiconductor layer sequence with a first layer having a doped semiconductor material, and a second layer, and a second semiconductor layer sequence disposed atop the second layer and having an active zone configured to generate light, wherein the first layer includes at least a first region having a porosity level which is at least 20% greater than a porosity level of a second region, and a trench separating the first region from the second region, and wherein the carrier is bonded either to the first layer or to a side of the second semiconductor layer sequence remote from the first semiconductor layer sequence.

35 Claims, 7 Drawing Sheets

(56)          References Cited

U.S. PATENT DOCUMENTS

| | | |
|---|---|---|
| 2013/0011656 A1 | 1/2013 | Zhang et al. |
| 2017/0237234 A1 | 8/2017 | Han et al. |
| 2020/0152841 A1* | 5/2020 | Han ...................... H01L 25/167 |
| 2020/0227255 A1 | 7/2020 | Zhu et al. |

* cited by examiner

OPTOELECTRONIC COMPONENT AND METHOD FOR PRODUCING A LIGHT-EMITTING SEMICONDUCTOR BODY

This patent application is a national phase filing under section 371 of PCT/EP2021/079840, filed Oct. 27, 2021, which claims the priority of German patent application 10 2020 128 679.1, filed Oct. 30, 2020, each of which is incorporated herein by reference in its entirety.

TECHNICAL FIELD

The present invention relates to an optoelectronic component and to a method of producing a semiconductor body, especially an optoelectronic component for emission of light of different wavelength.

BACKGROUND

In order to produce multicolor pixels for a display, for example, individual different-colored LEDs based on different materials are frequently produced individually and then assembled on a wafer by means of various transfer processes. This may work well in the case of larger LEDs; in the case of small LEDs or a larger number of pixels for a display, the amount of work involved becomes much greater and there is a significant rise in faults in the individual steps. Alternatively, it is possible to produce blue- or UV-emitting LEDs based on GaN or GaP, which then emit light in the desired color via full conversion. For this purpose, conversion layers are needed in the same pattern on the emission side.

The measures taken to date feature an elevated level of complexity in production, since additional steps are needed in production or else in adjustment.

SUMMARY

Embodiments provide a component which is suitable as a pixel for displays and is producible with reduced complexity. Further embodiments provide a method for producing a semiconductor component.

In the production of semiconductor components, different or at least modified material systems are often used in order to create the necessary functionality. These material systems may have a different lattice constant, meaning that the atoms in the lattice structure thereof have different separations in the respective material system. As well as the lattice separation, there is also a change in electrical properties. A known representation that shows the relationship between bandgap and lattice constant can be found at the following address: https://de.wikipedia.org/wiki/III-V-Verbindungshalbleiter*/media/Datei:III-V-Halbleiter.png. This shows bandgap plotted against lattice constant in a wurtzite structure and in a zinc blende structure. The lines between the elements represent the ternary compounds. The wurtzite crystallization has 2 lattice constants a and c, zinc blende just one.

A lattice constant in this connection is understood to mean the length of a unit cell in a defined material system. The material system is homogeneous and does not contain any (lattice) defects. It is thus undistorted. The lattice constant is a characteristic parameter for any material system, is based on the undistorted material system, and is referred to as specific lattice constant in that case too. Different material systems may accordingly have a different specific lattice constant, as shown in the above link. If, therefore, material systems having different lattice constants are combined, distortion arises in a boundary region of the systems, i.e. the lattice constants change. This change decreases with increasing distance from the boundary region. Moreover, excessively large differences in lattice constants can result in faults or defects. The proposed method and also the executions of the invention can specifically exploit this effect.

When materials of different specific lattice constant grow onto one another, there will inevitably be distortions which, when they reach a particular size, can become defects. On the other hand, the distortion can be exploited in a controlled manner in order to affect the bandgap of a semiconductor component, in order, for example, to alter the color of emitted light in the case of optoelectronic components.

Presented hereinafter are a component and a method of production thereof, in which, by means of a specific electrochemical process, called porosification, material systems based on GaN can be applied to substrates, the wavelength of which has been altered in a controlled manner by comparison with GaN. This makes it possible to achieve various improvements, such as elevated thermal stability and higher efficiency, for example in the InGaAlP or else InGaN material system. This is because, in that specific case, the formation of efficient multiple quantum wells having high potential barriers is associated with great difficulties on account of the lattice mismatch. The inventive configuration and the method permit compensation of this lattice mismatch and hence obtaining of the desired results and improvements.

In this regard, the inventors propose an optoelectronic component that comprises a carrier which provides a first semiconductor layer sequence with a first layer comprising a doped semiconductor material and with a second layer. Disposed atop the second layer, which may also be undoped, is a second semiconductor layer sequence having a zone active in respect of light generation. This material in one layer of the second semiconductor layer sequence applied atop the second layer has a different lattice constant compared to a material of the second layer. The first layer then comprises at least a first region that has been porosified. It is optionally possible to provide a second region which is non-porosified. In this case, a trench separates the first region from the second region. This arrangement of the first and second layer sequence is positioned on the carrier, either by the first layer or by the side of the second semiconductor layer sequence remote from the first semiconductor layer sequence.

By virtue of the aforementioned arrangement, it is possible to specifically alter the bandgap of the active zone formed for generation of light via distortions in the material and compensation thereof via the porosified region, such that light of different wavelength can be emitted. It is possible for the porosified region to assume further functions and to serve, for example, as outcoupling structure. Owing to the relatively low bond strength on a carrier, it is more easily possible to detach a component thus manufactured via a laser liftoff or another method, and hence to transfer it to a final carrier. Finally, it is possible to introduce a substance into the interstices or pores in the porosified region in order to influence optical properties or else emission properties. This may, for example, be a converter material, such that the proposed component is suitable for emission of light in various colors (or else white light).

An auxiliary carrier is a carrier made of an inert material which serves as basis for later procedures, especially epitaxial deposition of semiconductor materials. An example of a material for an auxiliary carrier is sapphire (Al$_2$O$_3$), but also silicon nitride, SiN, or another material. It may be appropriate for the material to be inert with respect to various etching processes that are used in the production of semiconductor components. In some cases, the auxiliary carrier remains on the component and becomes part thereof, in which case the auxiliary carrier is also referred to simply as carrier substrate. In other cases, there is detachment (as set out further down) of a component produced on the auxiliary carrier.

A semiconductor material is generally understood to mean an undoped compound semiconductor material, unless explicitly stated otherwise. The term "undoped" in this case means that dedicated, deliberate and intentional doping with a different element or material is not undertaken. Defects or impurities that are always present in practice are not covered by doping in the context of this application. A compound semiconductor material is a combination of two, 3 or more elements that are produced in a crystal structure, so as to form a band structure, and the resultant element has electrical semiconductor properties. A typical compound semiconductor is what is called a III-V compound semiconductor, which consists of one or more elements from the fifth main group and one or more elements from the third main group. Examples of compound semiconductor material are GaAs, AlGaAs, GaN, AlGaN, InGaN, GaP, AlGaP, AlInGaN, AlInGaP, AlInGaN and others that are mentioned here.

A doped semiconductor is a semiconductor material into which a dopant is introduced in a dedicated manner. Depending on the desired doping, the dopant in the case of a III-V compound semiconductor may, for example, be C, Si or Ge for n doping and, for example, Mg for p doping. Further dopants are listed in this application. The dopant is introduced during epitaxial deposition of the III-V compound semiconductor material, but the doping can also be effected subsequently by various methods. The dopant concentration is several orders of magnitude lower than the concentration of the atoms in the starting material or base material. For example, the concentration is in the range from $1*10^{17}$ dopant atoms/cm$^3$ to $1*10^{21}$ dopant atoms/cm$^3$.

Electrochemical breakdown or electrochemical etching is a process in which a semiconductor material is dissolved with the aid of an electrical voltage and current. This allows a layer of the semiconductor material to be dissolved or etched. However, this process does not proceed uniformly, but does so nonuniformly, for example on account of dislocations or material defects. This can be exploited given a suitable selection of parameters, for example applied voltage and concentration of a dopant and of the semiconductor material to be etched. For example, a different speed and also porosity of the material to be etched is achievable. The term "electrochemical porosification" is thus understood to mean an electrochemical process that leaches material inhomogeneously from a body so as to leave a porous or spongelike structure. A porosified semiconductor body or a semiconductor layer thus produces a network structure similar to a sponge or a bone that has sufficient stability coupled with simultaneously low mass or material volume.

A layer may be subjected to a selective porosification process in which a structured mask is applied before the process. This reduces or prevents current flow in regions of the layer on account of what is called shadowing, such that only very low porosification, if any, takes place in regions over which a mask is disposed. Correspondingly, a non-porosified semiconductor body does not exhibit a mesh- or sponge-like structure, even though it may nevertheless have various (lattice) defects. Moreover, in some executions, there may be effects in the boundary region in which a section of an intrinsically non-porosified region shows slight porosification, especially at the edges of such a region, in which case, however, what is called the porosity level (see further down) decreases with increasing distance from the edges.

In the case of a non-porosified region, penetration of an electrolyte during the electrochemical etching process is made more difficult or likewise prevented beneath the shadowed regions, such that no further etching channels can be formed there, and existing channels are not widened by the electrolyte. As a result, the removal rate is distinctly smaller in the shadowed regions, such that the material is porosified there to a much lesser degree, if at all.

The term "porosity level" describes the ratio of material volume to the total volume of the layer. A porosity level in the region of 50% thus means that 50% material has been removed compared to the original volume. In the case of a porosity level of 90%, 90% of the material has been leached out by the electrochemical deposition process, and only 10% of the material remains. In some aspects, porosity level of the porosified regions of the first layer is at least 20%. A porosity level may likewise be between 50% by volume and 90% by volume.

It should be mentioned at this point that a base material system of the first layer sequence is different than a base material system of the second layer sequence, which also results in a different lattice constant of the respective material system.

In some aspects of the component, the second semiconductor layer sequence comprises a layer adjacent to the second layer of the first semiconductor layer sequence and having an indium content in the range from 0.001% to 25%, for example in the range from 2% to 20%. The layer may also be designed as a superlattice or may in turn comprise a layer sequence. Later layers of the second semiconductor layer sequence, especially those that contribute to optical functionality, may have an indium content of at least 20%, especially of at least 40%, and especially in the range from 30% to 60%.

In one aspect, the trenches are designed as cavities, meaning that they are present only in the first layer sequence, and the second layer sequence grows over them. Alternatively, the trench stretches from a surface of the second layer sequence, i.e. a side of the second layer sequence remote from the first layer sequence, down into the first porosified layer of the first layer sequence.

In this way, the trenches, in some aspects, may divide the second layer sequence into regions that are each designed for emission of light, with each region disposed above one of the first and second regions. In this arrangement, it is possible in a controlled manner via local variation of the distortions to exploit resultant variation in the bandgap of the active zone. Alternatively, it is also possible for a distortion to achieve local variation in the lattice constant, such that there is a change in the stoichiometric composition of the material grown on during a growth process, which in turn alters the bandgap. This effect can be exploited, for example, in the case of indium-containing material systems since the ratio of Ga/In is shifted in the indium direction and hence to longer wavelengths with rising lattice constant. As well as indium, this effect can possibly also be achieved with Al or another material which, depending on the lattice constant, is incorporated with stoichiometric variation and hence brings about a change in the bandgap.

Thus, in some executions, light from a region of the active zone disposed above or below the second region of the first layer has a shorter wavelength than light from a region of the active zone disposed above or below the first region of the first layer. The dimension of the regions and of the trenches may be matched to the respective use. Thus, in some aspects, a width of the trench is in the range between $\frac{1}{15}$ and $\frac{1}{5}$ of a distance between 2 trenches. In particular, the distance between 2 trenches may be about 10 times as high as the width of a trench. A width of a region of the first layer is in the range from 500 nm to 2500 nm, or else between 500 nm and 2000 nm. In particular, it may be less than 2000 nm.

The material used may be different semiconductor compounds. For instance, a material system for the first or second layer sequence may include at least one of the following materials: GaN, GaP, AlGaN, InGaN, AlInGaN, AlInGaP and AlGaAs. The material system for the first and second layer sequences should be different. In addition, the material systems may be intrinsic, i.e. undoped, or else n- or p-doped. For this purpose, Si, C, Se, Te, Sn, Ge or Mg may be used with a concentration in the range from $1*10^{17}$ atoms/cm$^3$ to $1*10^{21}$ atoms/cm$^3$.

The doping may be adjustable in the first layer in order, for example, to create a gradient during the porosification and hence to locally alter the porosity level.

In some aspects, the second layer sequence of the component is designed as an optoelectronic semiconductor body, especially as a vertical LED.

Some aspects are concerned with the generation of light of different wavelengths. There are various proposals for this purpose that exploit the flexible options for porosification. In some aspects, the first layer sequence comprises a third region in the first layer that has a porosity level between a porosity level of the first region and a porosity level of the second region, with the third region separated from the first and/or second region by a trench. Different porosity levels can achieve different distortions, thus influencing the process of growth of the material system, and ultimately varying the wavelength in a locally controlled manner.

The component may additionally comprise electrical contacts in regions of the first layer. In some aspects, the carrier is bonded to the side of the second semiconductor layer sequence remote from the first semiconductor layer sequence and forms at least a first region for outcoupling of light generated by the second layer sequence.

Another feature relates to a configuration in which converter material has been introduced into cavities of the porosified first region of the first layer. Converter material used may be quantum dots, where the size thereof corresponds to the size of the cavities. Alternatively, organic fluorescent dyes or inorganic phosphors or nanophosphors are possible, which have been introduced into the open pore structures of the first layer by means of a suitable solvent. Hermetic encapsulation (e.g. $SiO_2$, $Al_2O_3$, $Si_3N_4$, $TiO_2$, TaNx, multilayers thereof) may be present on the first regions in order to protect the converter material. Infiltration of gaseous converter materials is also conceivable. If pores of different kinds are generated in the pixels, multistage infiltration with different converters will lead to more than 2 emission colors on one component.

Thus, in some aspects, cavities in the porosified first region have a first cavity size. Cavities in the porosified third region, by contrast, show a second cavity size smaller than the first cavity size. It is then possible to infiltrate different converters into the cavities, in which case the pore size may be adjusted for the respective converter materials. For example, the cavities in the porosified first region are filled with a converter material for conversion of light generated in the active zone to light of a red wavelength. Cavities in a porosified third region are filled with a converter material designed for conversion of light generated in the active zone to light of a green wavelength.

Together with non-porosified regions in the first layer, it is thus possible to achieve an RGB pixel based on a single material system.

Some other features relate to a method of producing a semiconductor body or else an optoelectronic component. This comprises, in a first step, producing a first layer sequence on a carrier, comprising a first layer including a doped semiconductor material and a second layer applied thereto and including an undoped semiconductor material. A patterned mask is formed on the first layer sequence. This is followed by selective electrochemical porosification of the first layer, such that first regions of the first layer of the layer sequence with a porosity level of at least 20% by volume are porosified and second regions of the first layer of the layer sequence are not porosified. The second regions here are shadowed by the patterned mask. This is possible since a current during the electrochemical process gets below the regions of the mask only to a very reduced degree, if at all.

The method proposed further comprises forming a second, functional layer sequence atop the first layer sequence, wherein the second, functional layer sequence comprises a third layer that has been applied atop the second layer and includes an active zone for generation of light.

In one aspect, the second, functional layer sequence is formed prior to forming of a patterned mask on the first layer of the first layer sequence and the selective electrochemical porosification. Alternatively, the step of forming the second, functional layer sequence follows after formation of a patterned mask on the second layer of the first layer sequence and the selective electrochemical porosification.

In this way, it is possible to flexibly establish the executions described above and hereinafter. In some aspects, a resist mask is formed atop the first or second layer sequence in a further step for mesa patterning, in which case the resist mask is patterned for creation of trench structures. This can create trenches at least in the first layer sequence when the resist mask for mesa patterning has been applied atop the first layer sequence. If, by contrast, the resist mask for mesa patterning has been applied atop the second layer sequence, the trenches are created in the second and in the first layer sequence.

Depending on the configuration, in some methods, there may already be existing mesa patterns when a mask material is applied atop the first layer of the first layer sequence. In some aspects, this may thus extend over at least a subregion of at least one trench in the first layer sequence. The mask material here may fill part of the trench in the region of the first layer with mask material. This process may be desirable in order, for example, to protect side walls during the electrochemical process.

The dimensions chosen in the structured mask may be somewhat greater than the second region(s) of the first layer that are not to be porosified beneath the structured mask. This can reduce any slight occurrence of underetching during the electrochemical deposition process.

Another aspect is concerned with the production of further porosified regions having different parameters. This enables the creation of different distortion or other applications, by means of which optoelectronic components are formed that emit light of different wavelength.

For this purpose, in some aspects of the principle proposed, it is envisaged that a second patterned mask is formed atop the first layer sequence and then the first layer sequence is porosified selectively and electrochemically, so as to form third regions of the first layer of the first layer sequence. A pore size or porosity level of the third regions are different with regard to a pore size or porosity level from the first regions of the first layer.

This can create regions such that the second, functional layer sequence is formed with an active zone for emission of light of a first wavelength above the first porosified regions, with an active zone for emission of light of a second wavelength via the second non-porosified regions, and with an active zone for emission of light of a third wavelength via the third porosified regions.

As well as distortion or relaxation of quantum well structures for generation of light of different wavelength, light can also be converted to a desired wavelength. For this purpose, it is possible to use converter materials. In some executions, a first converter material is introduced into the first porosified regions. This can provide pixels having emission areas that emit two different colors. For creation of RGB pixels, it is possible also to introduce a first converter material into the first porosified regions, and a second converter material into the third regions. First and second converter materials convert light to different wavelengths. Moreover, in some aspects, the first and second converter materials are of different size. Since conversion of light depends on the concentration and thickness of the converter material, it is appropriate to choose the thickness of the first layer such that the conversion material introduced results in full conversion.

Converter material used may be quantum dots, fluorescent dye, phosphor-based converter material, nanophosphors with grain sizes in the nanometer range, or other converters on a liquid or gaseous basis. These diffuse or are infiltrated into the porosified regions.

A further aspect relates to the outcoupling of light from the optoelectronic component. In one aspect, the first layer sequence is detached from the carrier, with the porosified first layer remaining on the second functional layer sequence and optionally being executed as an outcoupling structure for electromagnetic radiation.

A lattice constant of the two-dimensional third layer may differ within a range of 0.4% to 3%, or else within a range between 0.5% to 2.7%, from a lattice constant of the second layer. This difference corresponds to an indium content between 5% and 25%. This means that the distortions do not become too great and the defect density is within an acceptable range. Materials for the first or second layer sequence may be different. Possible base materials are based on GaN, GaP, AlGaN, InGaN, AlInGaN, AlInGaP and AlGaAs. The first layer may be provided with a dopant during epitaxial deposition, especially with Si, Ge, C or Mg.

For distortion, in some aspects, it is envisaged that the base material used in the second layer of the first layer sequence is undoped GaN, and the third layer is formed with an indium-containing layer, for example InGaN, where an indium content is in the range between and 25%. In the case of formation of trenches, defects in materials with a wurtzite structure can be reduced by aligning coalescence surfaces such that they are perpendicular to an axis [1120].

BRIEF DESCRIPTION OF THE DRAWINGS

Further aspects and embodiments according to the principle proposed will be revealed in relation to the various embodiments and examples that are described in detail in conjunction with the accompanying drawings.

DETAILED DESCRIPTION OF ILLUSTRATIVE EMBODIMENTS

Figures 1A, 1B, 1C, 1D, 1E:
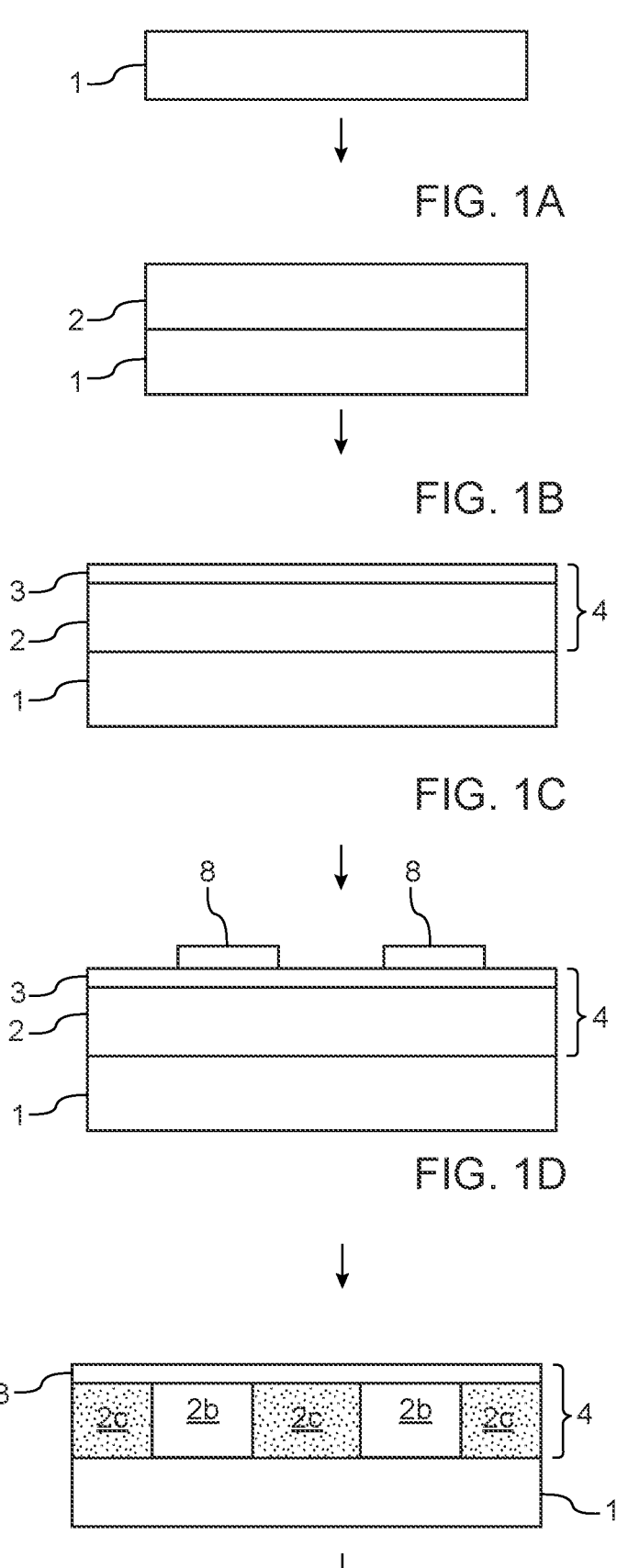
FIGS. 1A-1I show a first working example of an optoelectronic component and a method of production thereof according to embodiments.

The embodiments and examples that follow show various aspects and combinations thereof according to the principle proposed. The embodiments and examples are not always true to scale. It is likewise possible for various elements to be shown in enlarged or reduced form, in order to emphasize individual aspects. It will be apparent that the individual aspects and features of the embodiments and examples shown in the figures can be combined directly with one another without this impairing the principle of the invention. Some aspects have a regular structure or shape. It should be noted that slight variances from the ideal shape may occur in practice, but without being contrary to the concept of the invention.

Moreover, the individual figures, features and aspects are not necessarily shown in the correct size, and the proportions between the individual elements also need not necessarily be fundamentally correct. Some aspects and features are emphasized in that they are shown in enlarged form. Words such as "top", "above", "bottom", "below", "larger", "smaller" and the like are, however, represented correctly in relation to the elements in the figures. For instance, it is possible to infer such relationships between the elements from the drawings.

The inventors have recognized that the partial electro-chemical breakdown (called porosification here) of an exactly defined GaN-containing layer results in a significant reduction of a bonding force of a GaN epitaxial stack to the epitaxy substrate (sapphire or else Si, GaN) or else to other layers still to be grown. This etches very homogeneous pores (in the range of 20 nm to 100 nm)—in homogeneous distribution—into the specific GaN layer. The selectivity of the "porosification" can be achieved through high n doping (Si) of the GaN layer, i.e. only sufficiently highly doped layers are porosified. The density and size (size distribution) of the pores together with the lateral dimensions of the pixels determine the degree of mechanical relaxation and hence the lattice adjustment to highly indium-containing InGaN layers. The emission color of the LED structures grown on can thus be adjusted differently via locally different indium incorporation and a greater or lesser extent of distortion on the pixels.

As well as a reduced bond strength, improved relaxation is additionally achieved. This means that porosification also reduces a force between the porosified layer and still further layers to be grown on. In the case of different lattice constants, the porosification thus greatly reduces the distortions in the layer to be grown on, such that these can grow on essentially without lattice defects. This effect can be exploited firstly by producing porosified and non-porosified regions alternately and hence creating local different distortions. Secondly, the effect of distortion relaxation can also be enhanced by introducing additional mesa patterns with trenches, which contribute to a reduction in distortions on account of different lattice constants in the layer grown on top. The measure of (lattice) relaxation to give highly indium-containing layers is determined via the density and pore size and the dimensions of the functional semiconductor bodies, for example the optoelectronic layers.

Since a chemical etch attack is effected over the entire surface area via the vertical through-substance displacement in the GaN epitaxy layer stack, "porosification" can be effected throughout the wafer. The porosifying layer may be buried here under further GaN layers or else other material layers. In addition, it is possible via current flow, voltage, temperature, duration and other physical parameters to adjust pore size and pore growth. It is thus possible, for example, to produce pores of different size with different porosity levels. The different pore size permits introduction of different substances into the porosified layer. It is also possible via pore size to influence outcoupling or emission characteristics.

Alternatively, partial passivation of the surface in "porosification" can result in a laterally selective etch attack. By means of a mask applied, the buried regions in the porosifying first layer beneath the masked surface regions are shadowed and hence not porosified or only slightly porosified, i.e. etched, laterally in the plane, such that these may have different chemical and mechanical properties in subsequent process steps.

Optionally, an additional second layer may be inserted between the first layer to be porosified and the further layers that form the semiconductor component, such that this additional layer may serve as mechanical fracture site in a further process step. In this way, depending on the application and design, different regions may have laterally or vertically different porosity levels.

FIGS. 1A to 1J show a first working example of the proposed method of producing optoelectronic components, which implement some aspects of the principle proposed. In a first step, as shown in FIG. 1A, a carrier substrate 1 is provided. The carrier substrate in this working example comprises a sapphire carrier which is particularly suitable for the deposition and growth of semiconductor materials based on GaN. In a second step, in FIG. 1B, a doped GaN layer 2 is then applied to that auxiliary carrier 1. The n-doped GaN layer is applied by an epitaxial growth method, wherein the dopant is also introduced during the growing. The dopant used for GaN is silicon, germanium or else carbon. The dopant concentration may be altered here during the growth of the GaN layer and matched to the later steps of a porosification. Then, in a subsequent step, an intrinsic GaN layer 3 is deposited onto the doped GaN layer. Said intrinsic GaN layer 3 is undoped. Alternatively, it is also possible to apply a layer of undoped InGaN, with the indium content of said layer being chosen such that no great distortions occur.

In a subsequent step, shown in FIG. 1D, a patterned mask is applied to the intrinsic or undoped GaN layer 3 of the layer sequence 4. The mask is a photoresist mask which is inert to the later electrochemical detachment process that follows, among others. The mask structure hides various regions in the intrinsic GaN layer 3 and the doped GaN layer 2, and hence serves to define the later non-porosified regions. The thickness chosen for the mask structures 8 is somewhat greater than the thickness desired later, in order to compensate for slight underetching that occurs during the porosification. For nitrides, the underetch may be in the range from 200 nm to about 800 nm; for materials based on GaAs or GaP, the underetch may also be greater than woo nm. The dimension and lateral extent must be chosen accordingly.

In a subsequent step, the structure produced in FIG. 1D is then subjected to an electrochemical dissolution process. For this purpose, a current flows through the layer sequence 4, which brings about porosification of the doped GaN material in the region of layer 2 in particular. In the regions that are shadowed or covered by the mask 8, current flow is somewhat lower, such that there is only very minor porosification here, if any.

The reason is the fact that the current takes the path of least resistance in particular, and hence the shortest path in particular through the layer sequence 4. On account of the mask applied atop the layer 3, flow of current through the regions of the layer sequence 4 beneath the mask is thus reduced or prevented. After the porosification process, the mask 8 is removed again. The resultant structure is shown in FIG. 1E and comprises, in the first layer 2 of the layer sequence 4, porosified regions 2c and non-porosified or barely porosified regions 2b. The undoped GaN layer 3 is barely attacked, if at all, by the porosification process and hence remains in the porosified and non-porosified regions.

According to the principle proposed, the porosification process is effected by applying a voltage and passing a current through the layer sequence 4. In this case, the porosification of the individual regions 2c may be adjusted firstly via the doping of the first layer 2 and via the voltage applied, and via the current flowing through the layer sequence 4 and the duration of the porosification. Through a suitable choice of these parameters, it is thus possible to control and adjust both the pore size of the porosified regions and the porosity level of the regions 2c over a wide range. A temperature during the electrochemical dissolution process or a medium surrounding the structure, for example an acid, alkali or salt-containing solution, can also influence the porosification with regard to its degree and the pore size.

In a subsequent step, an optically active semiconductor structure is applied to the undoped layer 3 of the layer sequence 4. For this purpose, the first step is to deposit an n-doped layer 10, for example, atop the undoped layer 3. The n-doped layer 10 is not in the same material system as the layer 3, but in a different material system. An example used here is InGaN with a high indium content in the range from 5% to 20%. It is alternatively possible to use a different indium-containing layer. This material system of layer 10 has a distinctly different lattice constant compared to the undoped layer 3 of GaN. In this respect, the optoelectronic components should continue to be manufactured with this different lattice constant 10.

By virtue of the porosified and non-porosified regions that exist beneath layer 3, relaxation depending on the respective position of the regions in the layer 2 is achieved in the layer 10. In other words, layer 10, in the regions beneath which porosified regions 2b of the first layer 2 are disposed, is not distorted or distorted only slightly, if at all. By contrast, distortion in layer 10 above the non-porosified regions 2b of layer 2 is much more marked. By virtue of the arrangement of the porosified and non-porosified regions, local distortion of the lattice structure in layer 10 is thus adjustable. Nevertheless, layer 10 is grown in an essentially planar manner onto layer 3, and lattice defects are distinctly reduced by virtue of the at least local relaxation and compensation of distortion. This means that an essentially planar and defect-reduced surface is created in layer 10, to which an optically active zone 11 is applied in a subsequent step.

The optically active zone 11 comprises one or more quantum well structures, the bandgap of which is established via the local distortion in layer 10. In other words, the porosified and non-porosified regions of the first layer 2 create local distortion in layer 10, which affects the incorporation of indium in the growth of the multiple quantum well, since the lattice constant is different over the differently distorted regions. On account of the different indium content, there is also a change in the bandgap that exists in the multiple quantum well in these regions. Thus, structures having a different bandgap are formed in the multiple quantum well 11, which thus emit light of different wavelengths in operation.

Subsequently, a p-doped layer 12 is applied to the multiple quantum well structure 11. Layers 10, 11 and 12 thus form the second layer sequence 6, which thus constitutes a functional layer sequence, a functional semiconductor body and, in particular, part of an optoelectronic component.

It should be mentioned at this point that the p-doped layer 12 is applied to the multiple quantum well structure 11. It is likewise also possible to vary the composition of the base material, i.e., for example, the In or Al content in the case of InGaN or InAlGaN as material of layer 12, in order to achieve confinement by altering the bandgap. The indium content alters the bandgap of the multiple quantum well, and the indium content in the InGaN material in turn depends on the lattice constant during the epitaxial growth process. The greater this is, the more indium is incorporated, with shifting of a wavelength of the light generated in the quantum well to the red region with increasing indium concentration. This material emits in the violet over and above an indium content of 7% in InGaN, in the blue over and above an indium content of 1%, and in the green over and above an indium content of 20%. Over and above an indium content of 25%, the wavelength is shifted into the red region of the visible spectrum.

The material system may likewise be based on InGaP or InAlGaP or else AlGaAs. Here too, an elevated indium content results in a distinct change in lattice constants, especially in layer 10 compared to a lattice constant of the undoped GaN layer 3. The rising indium content reduces the bandgap energy, such that light with greater wavelengths is produced as the proportion rises.

Figures 1F, 1G, 1H, 1I:
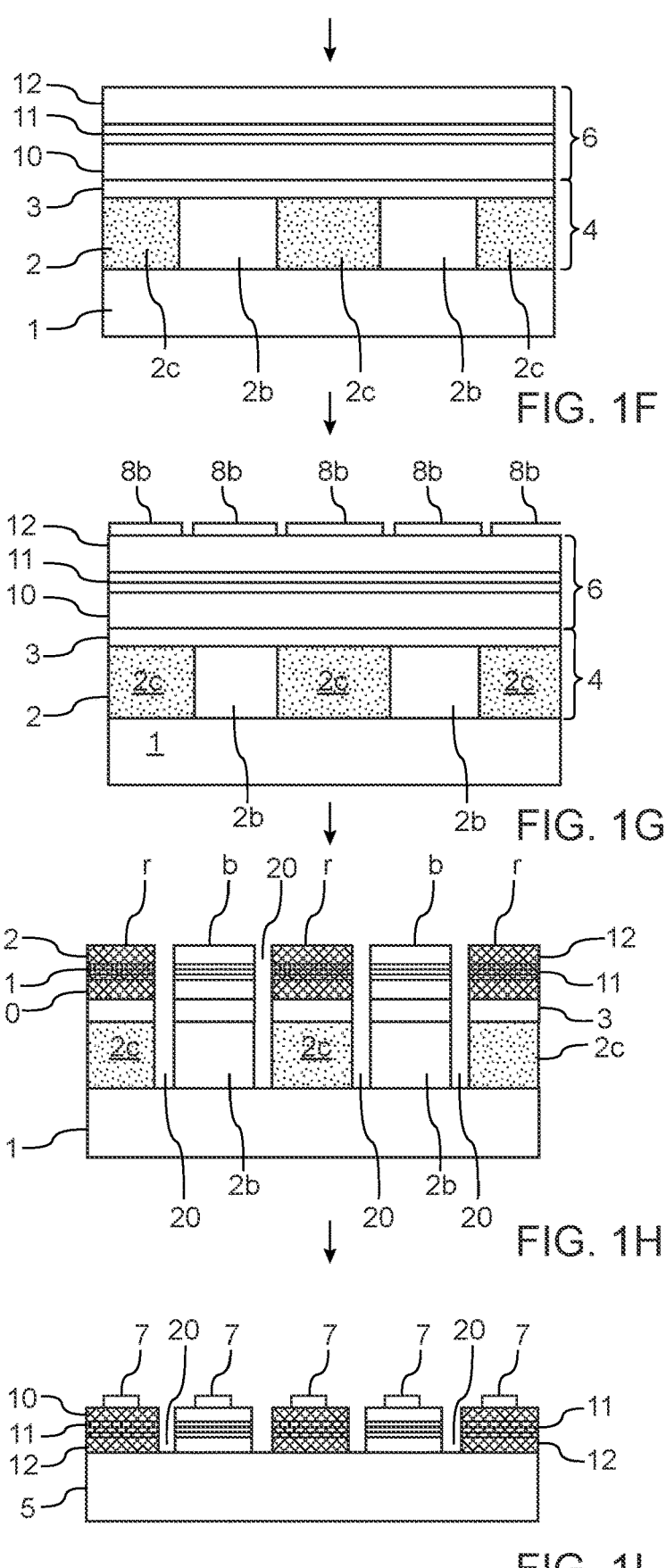

As shown in the present working example, FIG. 1F shows the resulting structure with layer sequences 4 and 6.

In a subsequent method step, as shown in FIG. 1G, a further mask structure 8b is applied to the second layer sequence 6. This mask structure 8b, as shown, is formed by different structures in strip form. The strips are above a non-porosified region and above a porosified region. In other words, in a top view of the semiconductor body, the region of layer 12 is above the interface between a non-porosified region and a porosified region free of mask material.

In a subsequent etching process, the regions exposed by the mask are selectively etched, and hence trenches 20 are formed in layer sequence 6 and layer sequence 4. The trenches 20 extend from the top face of layer sequence 6 down into layer sequence 4, and end just above carrier 1. A width of the trenches 20 is in the region of a few hundreds of nanometers. Formulated in general terms, the trenches 20 may have a width in the range from $\frac{1}{15}$ to $\frac{1}{5}$, especially about $\frac{1}{10}$, of a thickness of the porosified or non-porosified regions. The formation of such mesa patterning with multiple trenches results in formation of separated optoelectronic semiconductor bodies, each of which comprises a multiple quantum well. The multiple quantum well 11 of the respective optoelectronic components is either above a non-porosified region 2b or a porosified region 2c. In the latter case, the lattice relaxation creates distortion in layer sequence 6 during the growth, such that the bandgap is smaller there. On recombination of charge carriers in the bandgap, this results in emission of light shifted into the red wavelength range.

This means that the optoelectronic components r correspondingly emit more in the red region above the porosified regions. By contrast, the quantum structure 11 is distorted above the non-porosified regions, such that the resulting distortion results in lower incorporation of indium (or another material that increases the lattice constant) and hence leads to an increase in size of the bandgap. Correspondingly, in the case of a recombination of charge carriers, photons having a higher energy and hence a shorter wavelength in the blue region are generated here.

In a subsequent process step, a transfer or rebonding process is undertaken onto a final carrier 5. For this purpose, a final carrier 5 is applied to the surface of the optoelectronic semiconductor body formed and of the layers 12 and secured thereon. Subsequently, the auxiliary carrier 1 is detached from the surface, for example by a laser liftoff or another mechanical method.

The porosification that has been undertaken at least in part reduces the bond strength between the auxiliary carrier 1 and the first layer 2, as a result of which the auxiliary carrier can be more easily detached from the first layer 2. In a subsequent step, the porosified and non-porosified regions and the undoped GaN layer are removed. It is then possible to apply metal contacts 7 to the exposed regions of layer 10. The optoelectronic semiconductor bodies thus produced thus form vertical LEDs in this working example, which can emit light of different wavelength. The carrier 5 may contain electrical contact structures for contacting of the respective optoelectronic components, and a corresponding drive.

Alternatively, in the steps in FIGS. 1H and 1J, it is also possible to undertake a transfer from the auxiliary carrier 1 to the final carrier 5 in such a way that the porosified and non-porosified regions remain on the optoelectronic semiconductor bodies. In this case, the non-porosified and porosified regions may serve as additional outcoupling structures, in which case metallic contacts for electrical contacting are applied here too to the respective surfaces.

In the method shown in FIGS. 1A to 1J, the porosified and non-porosified regions are formed prior to formation of a mesa pattern with the trenches 20. In an alternative configuration of the method, these method steps may also be reversed. This means that a mask structure with masks 8b is first applied to the undoped GaN layer, and then a mesa pattern is formed with trenches in the first layer sequence 4. Porosification is effected only thereafter. Subsequently, layer sequence 6 is formed on layer sequence 4 which has thus been formed with trenches and porosified regions. In this case, layer 10 thus grows over the trenches. Layer 10 here forms bridges over the trenches 20, meaning that it grows only slightly into the trenches 20, if at all, and hence remains in the region of the undoped GaN layer 3. Trenches 20 are thus covered by bridges in this configuration and subsequently form cavities within the layer sequence 4. Such a configuration may be appropriate especially when the trenches 20 of such a mesa pattern contribute additionally to relaxation or distortion of layer 10 and multiple quantum well 6.

A further alternative configuration form for creation of optoelectronic components with light of different wavelength is shown by FIGS. 2A to 2F. In first method steps according to FIG. 2A, an auxiliary carrier 1 of sapphire is provided, and a first n-doped GaN layer 2 is applied thereto. Very thin buffer layers of undoped GaN or another material are applied between carrier 1 and n-doped GaN layer 2, in order to assure a surface of maximum planarity. The n-doped GaN layer 2 and the buffer layers are deposited epitaxially here too.

An undoped GaN layer 3 is applied atop the n-doped GaN layer 2. Layers 2 and 3 thus form the first layer sequence 4. A second layer sequence 6 for generation of light is then formed atop the first layer sequence 4. The second layer sequence 6 comprises a first n-doped layer 10 of InGaN, followed by a multiple quantum well 11 and a p-doped layer 12. Here too, it is alternatively possible to switch the doping of the n- and p-doped layers. The multiple quantum well 11 and the p-doped layer 12 likewise comprise InGaN as base material, wherein the concentration of indium is varied and various concentrations of p doping are used.

Figure 2A:
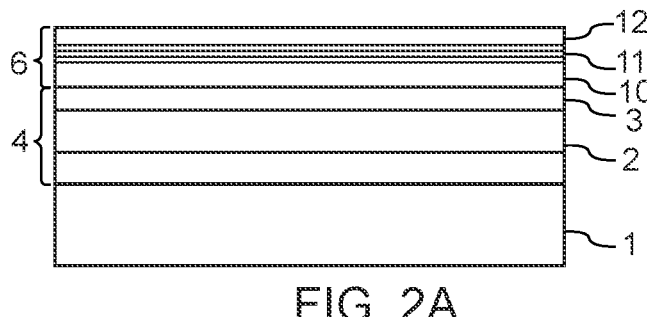
FIGS. 2A-2F show a second working example of an optoelectronic component and a method of production thereof according to embodiments.

The first layer sequence 4 with its undoped GaN layer 3 has a lattice constant distinctly different from the InGaN layer 10 of the second layer sequence 6. This results in distortions in layer 10, which extend into the multiple quantum well 11 and lead to a shift and increase in the bandgap there. Nevertheless, the indium content in layer 10 is chosen such that the resulting distortion does not lead to an excessive rise in lattice defects, and so, in addition, adequate efficiency of emitting charge carrier recombination is possible in the InGaN layer and especially in the multiple quantum well 11. The resulting structure composed of the auxiliary carrier 1, the first layer sequence 4 and the second layer sequence 6 is shown in FIG. 2A.

Figure 2B:
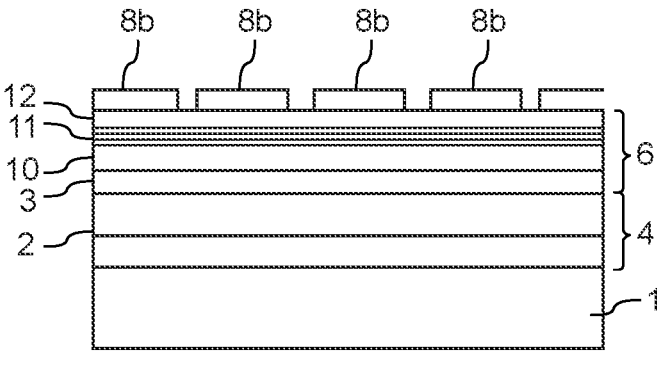

According to FIG. 2b, a first structured mask 8b which is then applied to layer sequence 6 is used to form a mesa pattern. After the patterned mask has been applied, the semiconductor is subjected to a selective etching process, such that trenches are etched into the regions of layer sequence 6 and of layer sequence 4 that are not covered by the mask pattern and hence are exposed, and these extend essentially down to carrier 1. In a top view of the semiconductor body, it is thus possible to produce rectangular, or else square or other patterns made of semiconductor material. Subsequently, the selective etching process and the forming of the mesa pattern with the trenches 20 is followed by a transfer of layer sequences 6 and 4 to a carrier 5. Carrier 5 already has multiple terminal contacts on its surface, which serve for electrical contact connection of the p-doped layer 12 to each optoelectronic semiconductor body. In addition, carrier 5 may already comprise integrated circuits or other elements for driving of the semiconductor bodies. The optoelectronic semiconductor bodies are each separated from one another by trenches and essentially comprise layer sequences 4 and 6 or—to be exact—regions thereof.

Figure 2C:
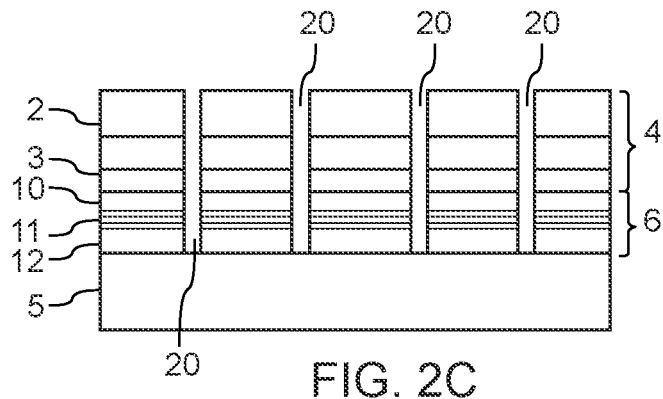

Each region of the layer sequence 6 in turn has a p-doped layer 12 secured to the chip carrier 5, and a multiple quantum well 11 and an n-doped layer 10. These are adjoined by layer sequence 4 with the undoped GaN layer 3 and the doped GaN layer 2. FIG. 2c shows a configuration comprising multiple optoelectronic components of a chip carrier 5 that are separated by the mesa pattern with its trenches 20.

Figure 2D:
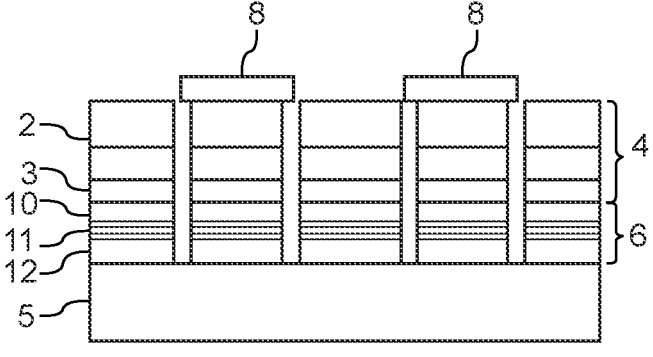
Figure 2E:
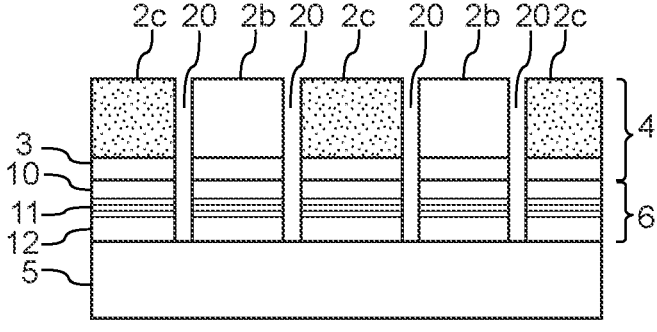

In a subsequent step, a mask structure 8 is applied to the surface of the doped GaN layer 2. As shown in FIG. 2D, the dimension of the mask 8 is chosen such that it projects beyond the respective doped GaN layer 2 and hence also at least partly covers the adjacent trenches 20. In some working examples, which are not shown, the mask material may also flow or extend into the trenches and hence also cover the side walls of layer sequence 4 or 6.

Subsequently, the pattern provided with the mask is subjected to a chemical dissolution process or a porosification process. This porosifies the regions of layer sequence 4 that are not covered by the mask, and especially of the first layer 2, by virtue of the current flow, so as to result in the porosified regions 2c. The regions 2b covered by the mask remain non-porosified since the flow of current is much lower, or entirely absent, as a result of the regions of layer sequence 4 that are shadowed by the mask. Subsequently, mask 8 is removed again, so as to result in the pattern shown in FIG. 2D.

The pattern formed in the porosified regions 2b comprises pores with a certain distribution, although the pore size is adjustable within wide ranges via parameters during porosification. This makes it possible to establish a pore size suitable for accommodating a converter material. A useful converter material for this purpose is, for example, a fluorescent dye, but also quantum dots or phosphor-based and especially nanophosphor-based converter material, the grain size in the case of the latter being only a few tens of nanometers.

Figure 2F:
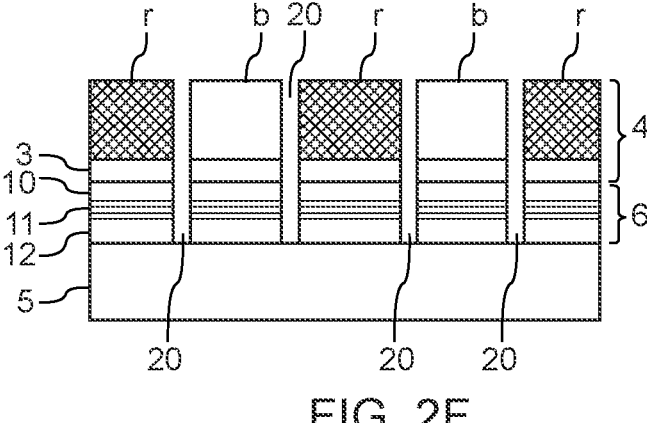

In one working example, the pattern is dipped into a bath containing a liquid converter material, such that conversion particles penetrate into and are deposited in the pores of the porosified material 2c. For this purpose, the converter material may have been introduced in a solvent that evaporates in the pores, such that the converter material remains on the walls of the pores or cavities of porosified regions 2c and accumulates there. After this process, excess converter material in the non-porosified regions or else in the trenches 20 may be removed, so as to result in the structure shown in FIG. 2F. The converter material then serves, in operation of the semiconductor body, to convert the light of a first wavelength generated by the multiple quantum well 11 to light of a second wavelength. The converter material in the porosified regions 2c in the working example of FIG. 2F is designed, for example, to convert light of blue wavelength to light of a red wavelength. The concentration of the converter material in the porosified regions, designated r, is sufficiently large that full conversion takes place. In operation, therefore, these optoelectronic components therefore emit light in a red or reddish wavelength, while the components having the non-porosified regions emit light in the blue spectrum.

In this way, it is possible by selective porosification with subsequent infiltration of converter material to create a pixel field in which optoelectronic components generate red and blue light in operation. What is advantageous here is that the components are based on the same material system, InGaN in this case, and the different light is effected by distortion of the materials combined with the introduction of converter material. In this way, it is possible to produce elements comprising multiple pixels, with each pixel based on the same material system and generating light of a different color.

This principle of generating full conversion by means of converter material in porosified regions can also be used to produce what are called RGB pixels. This involves generating optoelectronic components based on the same material system. For instance, it is possible to use different porosity levels or different pore size in a porosified material for filling of different converter materials therein. Such a working example is shown in FIGS. 3A to 3H.

In first steps, as in the preceding example of FIG. 2A, a layer sequence 4 and a layer sequence 6 are deposited on an auxiliary carrier 1. As shown in the preceding working example, a resist mask as mask structure 8b is applied atop layer sequence 6, and a mesa pattern is formed there to create separate optoelectronic components. The individual method steps in FIGS. 3A to 3B correspond to the steps in FIGS. 2A to 2C.

Figures 3A, 3B, 3C, 3D:
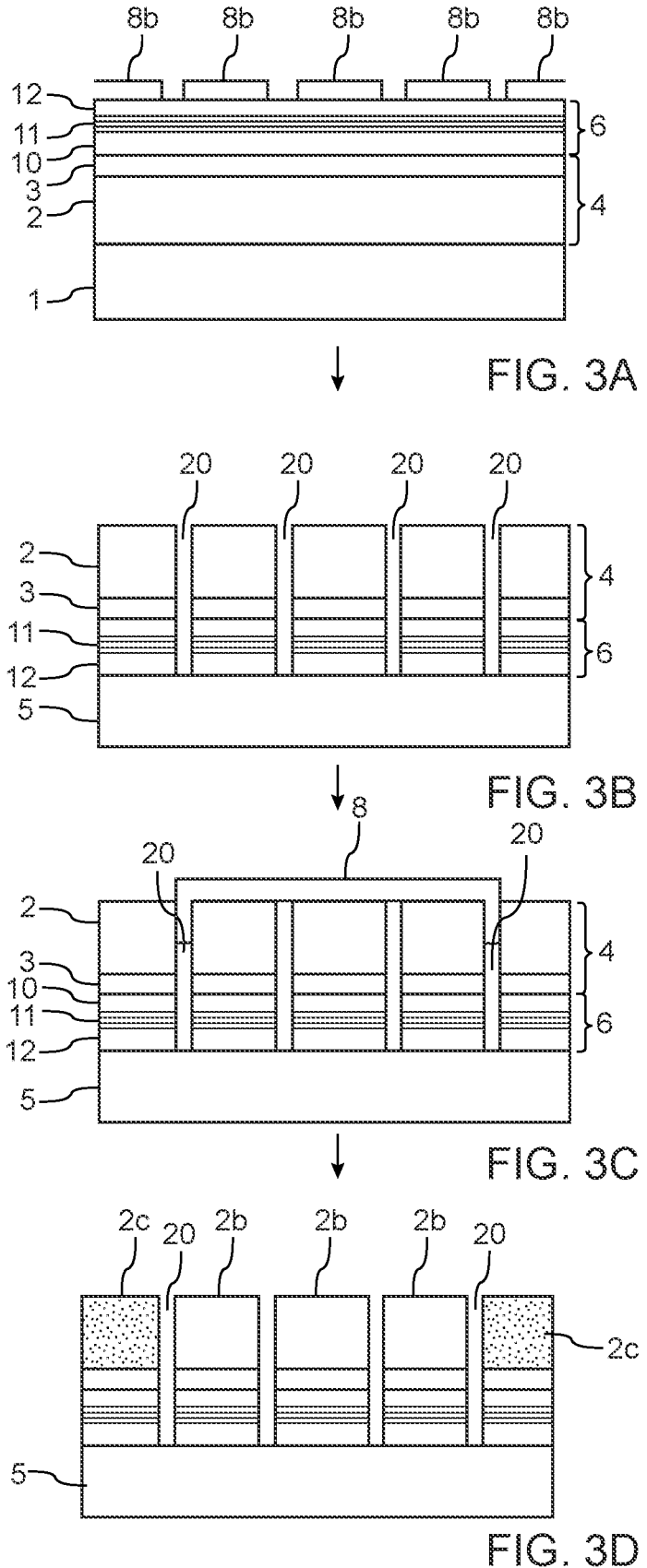
FIGS. 3A-3H show a third working example of an optoelectronic component and a method of production thereof according to embodiments.
Figure 3E:
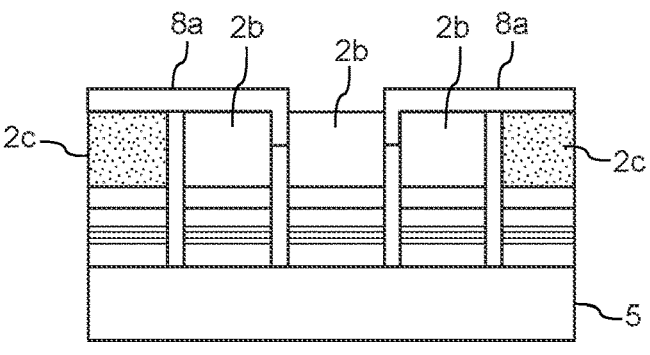

Subsequently, as shown in FIG. 3C, further masking is undertaken with a resist mask. The resist mask here is chosen such that it covers multiple semiconductor layers separated by trenches 20. In the working example, the mask structure 8 extends, for example, from the first trench 20 up to the last trench 20 and hence covers the intervening components and the trenches that separate these components. Only the two outer optoelectronic components in this working example remain covered by the mask structure.

Here too, as in the working example of FIG. 2, it is possible that the mask structure material extends to the outer trenches 20 and hence covers the side walls of layers 2 and 3 of layer sequence 4. This is indicated in FIG. 3C, wherein the mask material does not fully cover trenches 20. This is followed by a first porosification step for formation of first porosified regions 2c. The electrochemical dissolution process here is designed so as to form a defined first pore size in the porosified regions 2c. The pore size or the cavities in the first porosified regions 2c are designed to be able to accommodate quantum dots of a particular size.

Subsequently, the mask 8 is removed and a new resist mask with mask structure 8a is applied. The mask structure here is chosen such that it covers the porosified regions 2c and an adjacent, non-porosified region 2b. As shown in the working example, in FIG. 3B, the mask structure 8a thus leaves a central non-porosified region 2b exposed, which is surrounded by 2 further non-porosified regions 2b, which are in turn adjoined by a porosified region 2c with a first pore size.

Figure 3F:
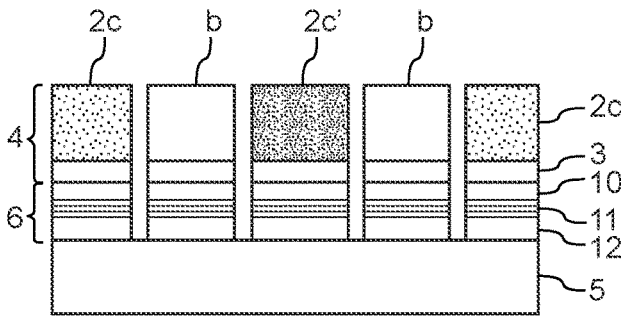

Subsequently, this structure covered by a mask 8a is also subjected to a further chemical dissolution process, and a second porosified region 2c' is created, as shown in FIG. 3F. However, the pore size chosen for this second porosified region 2c' is different compared to the first pore size in the porosified regions 2c. In particular, this pore size in region 2c' is less than the first pore size in the porosified regions 2c.

After the mask has been removed, what remain are thus first porosified regions 2c of a first pore size, second porosified regions 2c' having a second pore size, and non-porosified regions 2b. At least the latter create a distortion in the underlying multiple quantum well 11, such that, in operation, light with the shortest wavelength in the blue region, for example, is emitted here. By contrast, distortion in regions 2c and 2c' is altered, such that, on account of the altered bandgap, light of different wavelength and in particular longer wavelength can be generated. In this respect, the structure in FIG. 3F is already capable of generating light with different wavelength and of outcoupling it along the surface of layer 2.

In a further alternative configuration, the porosified regions 2c and 2c' may also be used to introduce different converter material into them and hence generate light of a defined color. This aspect is illustrated in FIGS. 3D to 3H.

Figure 3G:
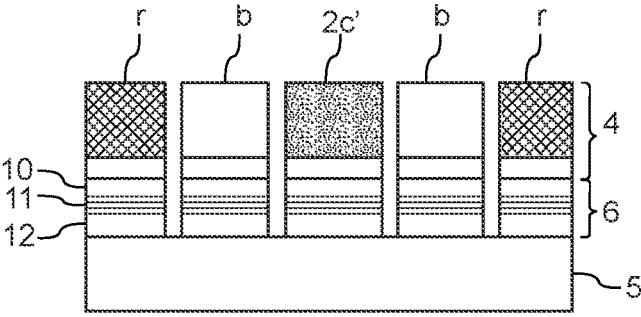

In a first step, in FIG. 3G, the semiconductor components are dipped into a first converter material, such that it infiltrates and is deposited in the porosified regions 2c. On account of the different pore size in the porosified regions 2c and 2c', the converter material r is capable merely of penetrating into and being deposited in the porosified region 2c. In other words, the individual molecules and particles of the converter material r are too large for the pore size of the second porosified region 2c. Converter materials used here may also be dyes, phosphors, nanophosphors or else quantum dots, in which latter case the size of the quantum dots corresponds to the respective size.

Subsequently, the semiconductor structure thus formed is dipped into a second bath comprising a second converter material, and the second porosified region 2C is thus infiltrated with the second converter material. This converter material is then suitable for conversion of light to another wavelength. In this way, it is possible to create the structure shown in FIG. 3H, in which the porosified regions 2c and 2c' are filled with a different converter material.

In one region of the different electronic components, it is thus possible to generate light with a blue wavelength by means of the semiconductor components b, light with a red wavelength by means of the semiconductor components r, and light in a green wavelength by means of the semiconductor components g. In this way, it is possible to form an RGB pixel in which the InGaN material system is used for each subpixel, i.e. for each pixel of color r, g or b. The converter materials used are suitable for conversion of light to light of different wavelengths. By contrast with the preceding example in which a different wavelength is achieved via distortions or relaxation by means of a porosification, there is full conversion of the light here essentially by means of converter material.

In this respect, the demands on relaxation or distortion can be reduced, or have to be adjusted with particular accuracy only for the optoelectronic components for blue light b. The relaxation does alter the bandgap of the multiple quantum well 11, but the converter materials r and g can convert light over a wide range, and so they nevertheless generate defined light even in the case of an altered bandgap. In this configuration, this permits choice of a further parameter, so as to result in high flexibility in all directions.

For example, it is possible here, as well as different converter material, also to adjust the indium content and the porosification, i.e. pore size and degrees of porosity, over wide ranges in order to generate a desired RGB pixel. In a last step, the structure thus present can be hermetically encapsulated. Suitable examples for this purpose are transparent materials such as $SiO_2$, $Al_2O_3$, $S_3N_4$, $TiO_2$ or combinations thereof. Encapsulation reduces or entirely avoids degradation on account of oxidation or other effects.

As well as the infiltration of quantum dots, organic fluorescent dyes or phosphors in liquid form, another possibility is infiltration of gaseous converter materials into the porosified regions. This is applicable both to single-stage infiltration, as, for example, in FIG. 2, and to multistage infiltration with different converter materials in FIG. 3 to give more than 2 emission colors on one chip.

The thickness of the porosified layer 2 can be chosen during the growth process such that the achievable concentration of a converter is sufficient for full conversion. For example, the thickness of the porosified layer may be in the region of a few micrometers, including in the range from 1 μm to 5 μm. As already mentioned, the pore structure can likewise be adjusted differently in terms of its size and also its surface properties, such that different converter materials fit only into pores of a porosified region as a result. This principle is elucidated in FIGS. 3G and 3H, in which different-sized pores are used in the porosified regions 2c and 2c' in order to accommodate converter molecules of different size there.

For an improvement in the bonding of a converter material within the porosified region, it is possible to provide the converter with additional ligands or substituents that adhere particularly well to the surfaces of the pores. Another alternative would be selective wetting of the porosified region, especially of the surfaces of the pores in the porosified region, such that chemical or physical interaction results in particularly good adhesion of converter materials to the surface of the pores.

In another configuration, it is also possible to introduce converter materials selectively into the porosified regions by means of electrophoretic deposition. For this purpose, the optoelectronic components are contacted with the converter materials only after electrical connection of the components to a driver substrate or chip carrier 5. The semiconductor components to be contacted with a converter material are subjected to an electrical voltage in this method. The electrical voltage formed then causes the converter material to selectively penetrate into and remain in the structure by means of electrophoretic deposition.

Subsequently, other pixels may be subjected to the same procedure with other converter materials. Here too, it is appropriate, after electrophoretic deposition, to hermetically seal the resultant structures in order, for example, to prevent degradation or reabsorption of the converter material from the porosified region.

Figure 3H:
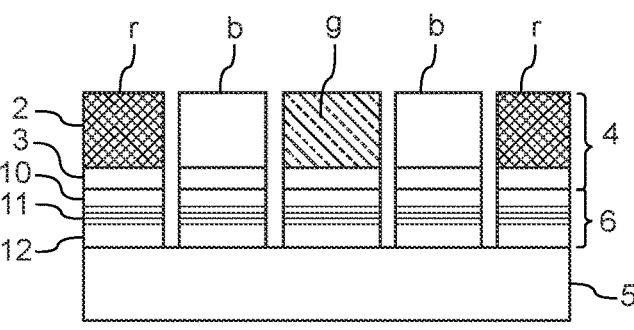

In FIG. 3H, after the completion, the non-porosified blue regions are not subjected to any further method step. This may be disadvantageous in some aspects since the porosified region that has been provided with a converter material can also additionally serve as outcoupling structure for light from layer sequence 6 into layer sequence 4. In order thus also to achieve improved outcoupling for the components with blue light, it is possible, in a further method step which is not shown here, to roughen or slightly porosify the regions of the GaN layer for the blue pixels. It is thus possible to optimize the coupling or else the emission characteristics for the blue pixels, or to match them to other converted pixels.

Figure 4:
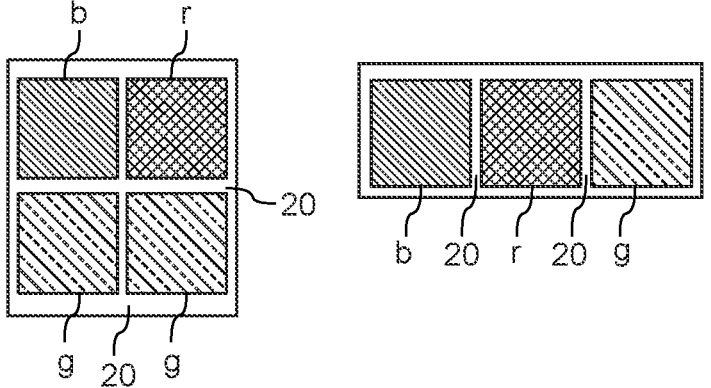
FIG. 4 shows a top view of an optoelectronic component.

FIG. 4 shows one possible arrangement of such a pixel with different converter materials or differently emitting emission areas. Each pixel here comprises at least 3 emission areas for blue, red and green light. These are based, as shown in the preceding working examples and methods, on the same material system, wherein the different color results from a combination of distortions and converter material introduced into porosified regions. In the left-hand part of the figure—shown in top view—the pixel comprises a blue emission region, a red region and 2 green emission regions that are separated by trenches 20. In this pixel, 2 green emission regions are provided, which can firstly be driven selectively and secondly serve to be able to cover the higher sensitivity of the eye in the green region. For this purpose, the green regions can emit light of the same wavelength, but may also be designed to emit light of slightly different wavelengths.

The right-hand part of FIG. 4 shows a pixel consisting of 3 subpixels that are likewise based on the same material system and are manufactured, for example, by a method presented here. Here too, the optoelectronic components are separated from one another by trenches 20. By means of a common layer applied atop the surface, components are operated as vertical light-emitting diodes and, by virtue of the layer, have a common anode or cathode.

In the embodiment shown here, layer 10 is n-doped and layer 12 of layer sequence 6 is p-doped. However, these may be switched without any detriment to the inventive concept. By virtue of the additional encapsulation, in particular, oxidative sensitive converter materials, by virtue of the embedding, the pores are protected and hence have much higher stability under mechanical stress.

The invention claimed is:

1. An optoelectronic component comprising:
a carrier;
a first semiconductor layer sequence with a first layer comprising a doped semiconductor material, and a second layer; and a second semiconductor layer sequence disposed atop the second layer and having an active zone configured to generate light,
wherein the first layer comprises:
at least a first region having a porosity level which is at least 20% greater than a porosity level of a second region, and
a first trench separating the first region from the second region,
wherein the carrier is bonded either to the first layer or to a side of the second semiconductor layer sequence remote from the first semiconductor layer sequence,
wherein the first semiconductor layer sequence further comprises a third region in the first layer that comprises a porosity level between the porosity level of the first region and the porosity level of the second region, and
wherein the third region is separated from the first region and/or the second region by a second trench.

2. The optoelectronic component of claim 1, wherein the second semiconductor layer sequence comprises a layer, which is adjacent to the second layer and which has an indium content in a range from 0.0001% to 25%.

3. The optoelectronic component of claim 1, wherein the first trench divides the second semiconductor layer sequence into regions that are each configured to emit light, and wherein each region is disposed above one of the first and second regions.

4. The optoelectronic component of claim 1, wherein the optoelectronic component is configured to emit second light in a region of the active zone disposed above or below the second region of the first layer and configured to emit first light in a region of the active zone above or below the first region of the first layer, and wherein the first light has a shorter wavelength than the second light.

5. The optoelectronic component of claim 1, wherein the first region has a porosity level of at least 30%.

6. The optoelectronic component of claim 1, wherein a width of the first trench is in a range between $\frac{1}{15}$ and $\frac{1}{5}$ of a distance between two trenches.

7. The optoelectronic component of claim 1, wherein the first layer and/or the second layer includes GaN, GaP, AlGaN, InGaN, AlInGaN, AlInGaP or AlGaAs, and wherein the first layer includes a dopant comprising Si, Ge, Te, Se or Mg, Zn, C, Be with a concentration in a range from $1*10^{17}$ atoms/cm$^3$ to $1*10^{21}$ atoms/cm$^3$.

8. The optoelectronic component of claim 1, wherein the second semiconductor layer sequence forms at least one optoelectronic semiconductor body.

9. The optoelectronic component of claim 1, further comprising electrical contacts arranged atop the regions of the first layer.

10. The optoelectronic component of claim 1, wherein the carrier is bonded to the side of the second semiconductor layer sequence remote from the first semiconductor layer sequence, and wherein at least the first region is configured to couple out the light.

11. The optoelectronic component of claim 1, further comprising a converter material arranged in cavities of a porosified first region of the first layer.

12. A method for producing a semiconductor body, the method comprising:
producing a first layer sequence on a carrier, the first layer sequence comprising a first layer including a doped semiconductor material and a second layer applied thereto and including an undoped semiconductor material;
forming a patterned mask on the first layer sequence, selectively electrochemically porosifying the first layer such that first regions of the first layer of the first layer sequence with a porosity level of at least 20% by volume are produced and such that second regions of the first layer of the first layer sequence are not porosified, wherein the second regions are shadowed by the patterned mask; and forming a second functional layer sequence atop the first layer sequence, wherein the second functional layer sequence comprises a third layer comprising an active zone configured for generating light.

13. The method of claim 12, wherein forming the second functional layer sequence precedes forming of the patterned mask atop the first layer of the first layer sequence and the selective electrochemical porosification, or wherein forming the second functional layer sequence follows forming of the patterned mask atop the second layer of the first layer sequence and the selective electrochemical porosification.

14. The method of claim 12, further comprising:

forming a resist mask for mesa patterning atop the first or second layer sequence, wherein the resist mask is patterned for creation of trench structures;

forming trenches at least in the first layer sequence when the resist mask has been applied atop the first layer sequence; or forming the trenches in the second layer and in the first layer sequence when the resist mask has been applied atop the second layer sequence.

15. The method of claim 14, wherein forming the patterned mask atop the first layer sequence comprises forming the patterned mask atop the first layer of the first layer sequence over at least a subregion of at least one trench in the first layer sequence, with optionally filling a portion of the trench with mask material in a region of the first layer.

16. The method of claim 15, wherein dimensions chosen in the patterned mask are greater than the second region(s) of the first layer beneath the patterned mask that are not to be porosified.

17. The method of claim 15, further comprising:

forming a second patterned mask atop the first layer sequence; and selectively electrochemically porosifying the first layer such that third regions of the first layer of the first layer sequence are formed, wherein a pore size or a porosity level of the third regions is different with regard to a pore size or the porosity level of the first regions of the first layer.

18. The method of claim 12, wherein the second functional layer sequence comprises the active zone for emission of light of a first wavelength via the first porosified regions and for emission of light of a second wavelength via the second non-porosified regions.

19. The method of claim 18, wherein the second functional layer sequence comprises the active zone for emission of light of a third wavelength via third porosified regions.

20. The method of claim 19, further comprising introducing a first converter material into the first porosified regions and introducing a second converter material into the third porosified regions, and wherein the first and second converter materials are of different size.

21. The method of claim 18, further comprising introducing a first converter material into the first porosified regions.

22. The method of claim 21, wherein a thickness of the first layer is chosen such that the first converter material introduced results in full conversion.

23. The method of claim 21, wherein the first converter material comprises quantum dots, fluorescent dyes, or a phosphor-based converter material.

24. The method of claim 12, further comprising detaching the first layer sequence from the carrier, wherein a porosified first layer remains on the second functional layer sequence and is optionally designed as an outcoupling structure for the light.

25. The method of claim 12, wherein a lattice constant of a two-dimensional third layer differs from a lattice constant of the second layer within a range of between 0.5% and 2.7%, inclusive.

26. The method of claim 12, wherein the first and second layers include GaN, GaP, AlGaN, InGaN, AlInGaN, AlInGaP or AlGaAs, and wherein the first layer is provided with a Si, Ge, Se, Sn, C, Zn, Be or Mg dopant during an epitaxial deposition.

27. The method of claim 26, wherein the second layer of the first layer sequence includes undoped GaN and the third layer comprises InGaN, with an In content within a range from 5% to 20%.

28. The method of claim 12, wherein, in materials having a wurtzite structure, coalescence surfaces are aligned such that they are perpendicular to an axis.

29. An optoelectronic component comprising:

a carrier;

a first semiconductor layer sequence with a first layer comprising a doped semiconductor material, and a second layer; and a second semiconductor layer sequence disposed atop the second layer and having an active zone configured to generate light, wherein the first layer comprises:

at least a first region having a porosity level which is at least 20% greater than a porosity level of a second region, and a trench separating the first region from the second region, wherein the carrier is bonded either to the first layer or to a side of the second semiconductor layer sequence remote from the first semiconductor layer sequence, and wherein the second semiconductor layer sequence comprises a layer, which is adjacent to the second layer and which has an indium content in a range from 0.0001% to 25%.

30. An optoelectronic component comprising:

a carrier;

a first semiconductor layer sequence with a first layer comprising a doped semiconductor material, and a second layer; and a second semiconductor layer sequence disposed atop the second layer and having an active zone configured to generate light, wherein the first layer comprises:

at least a first region having a porosity level which is at least 20% greater than a porosity level of a second region, and a trench separating the first region from the second region, wherein the carrier is bonded either to the first layer or to a side of the second semiconductor layer sequence remote from the first semiconductor layer sequence, wherein the first layer and/or the second layer includes GaN, GaP, AlGaN, InGaN, AlInGaN, AlInGaP or AlGaAs, and wherein the first layer includes a dopant comprising Si, Ge, Te, Se or Mg, Zn, C, Be with a concentration in a range from $1*10^{17}$ atoms/cm$^3$ to $1*10^{21}$ atoms/cm$^3$.

31. An optoelectronic component comprising:

a carrier;

a first semiconductor layer sequence with a first layer comprising a doped semiconductor material, and a second layer; and a second semiconductor layer sequence disposed atop the second layer and having an active zone configured to generate light, wherein the first layer comprises:

at least a first region having a porosity level which is at least 20% greater than a porosity level of a second region, and a trench separating the first region from the second region, wherein the carrier is bonded either to the first layer or to a side of the second semiconductor layer sequence remote from the first semiconductor layer sequence, wherein the carrier is bonded to the side of the second semiconductor layer sequence remote from the first semiconductor layer sequence, and wherein at least the first region is configured to couple out the light.

32. An optoelectronic component comprising:

a carrier;

a first semiconductor layer sequence with a first layer comprising a doped semiconductor material, and a second layer; and a second semiconductor layer sequence disposed atop the second layer and having an active zone configured to generate light, wherein the first layer comprises:

at least a first region having a porosity level which is at least 20% greater than a porosity level of a second region, and a trench separating the first region from the second region, and wherein the carrier is bonded either to the first layer or to a side of the second semiconductor layer sequence remote from the first semiconductor layer sequence; and a converter material arranged in cavities of a porosified first region of the first layer.

33. The optoelectronic component of claim 32, wherein the cavities in the porosified first region have a first cavity size, and wherein cavities in a porosified third region have a second cavity size smaller than the first cavity size.

34. The optoelectronic component of claim 33, wherein the cavities in the porosified first region are filled with a first converter material for conversion of the light to light of a first wavelength, and/or wherein cavities in the porosified third region are filled with a second converter material for conversion of the light generated to light of a second wavelength, and wherein the first and second wavelengths are different.

35. The optoelectronic component of claim 32, wherein the converter material comprises quantum dots, organic fluorescent dyes, nanophosphors, or phosphors.

*     *     *     *     *